United States Patent
Li et al.

(10) Patent No.: US 9,147,704 B2
(45) Date of Patent: Sep. 29, 2015

(54) DUAL PIXEL-SIZED COLOR IMAGE SENSORS AND METHODS FOR MANUFACTURING THE SAME

(71) Applicant: OmniVision Technologies, Santa Clara, CA (US)

(72) Inventors: Jin Li, San Jose, CA (US); Gang Chen, San Jose, CA (US); Yin Qian, Milpitas, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/076,823

(22) Filed: Nov. 11, 2013

(65) Prior Publication Data
US 2015/0130010 A1    May 14, 2015

(51) Int. Cl.
*H04N 5/235*    (2006.01)
*H04N 9/04*    (2006.01)
*H01L 27/146*    (2006.01)

(52) U.S. Cl.
CPC .... *H01L 27/14607* (2013.01); *H01L 27/14621* (2013.01); *H01L 27/14685* (2013.01)

(58) Field of Classification Search
CPC ....................................................... H04N 5/235
USPC ....................................... 348/229.1, 272, 273
See application file for complete search history.

(56) References Cited

U.S. PATENT DOCUMENTS 7,508,421 B2 *   3/2009   Tamaru et al. ............ 348/229.1
2012/0261730 A1   10/2012  Chen et al.

OTHER PUBLICATIONS

Melexis, Microelectronic Integrated Systems, MLX75411, MLX75412 Avocet HDR Image Sensors Datasheet, Aug. 2012, 70 pages.

* cited by examiner

*Primary Examiner* — Joel Fosselman
(74) *Attorney, Agent, or Firm* — Lathrop & Gage LLP

(57) ABSTRACT

A dual pixel-size color image sensor, including an imaging surface, for imaging of incident light, and a plurality of color pixels, each color pixel including (a) four large photosites, including two large first-color photosites sensitive to a first color of the incident light, and (b) four small photosites including two small first-color photosites sensitive to the first color of the incident light. The large and small first-color photosites are arranged such that connected regions of the imaging surface, not associated with large and/or small first-color photosites, are not continuous straight lines. A method for manufacturing a color filter array on an imaging surface of a dual pixel-size image sensor includes forming a first-color coating on first portions of the imaging surface to form large and small first-color photosites sensitive to a first color, wherein connected portions of the imaging surface, different from the first portions, are not continuous straight lines.

17 Claims, 14 Drawing Sheets

DUAL PIXEL-SIZED COLOR IMAGE SENSORS AND METHODS FOR MANUFACTURING THE SAME

BACKGROUND

Standard image sensors have a limited dynamic range of about 60 to 70 dB or less. For example, an 8-bit sensor has a dynamic range of only 48 dB. However, the luminance dynamic range of the real world is much larger and natural scenes often span a range of 90 dB or more. When an image sensor captures a scene with a luminance dynamic range in excess of the sensor dynamic range, information is necessarily lost. Depending on the exposure settings, the brighter regions may be saturated and/or the dimmer regions may be underexposed, producing a captured image of a quality unable to reproduce the actual scene.

In order to simultaneously capture highlights and shadows of a scene, image sensors have used High Dynamic Range (HDR) technologies to increase the captured dynamic range. One of the most common techniques to increase the dynamic range is to merge multiple exposures, captured with a standard, low dynamic range image sensor, into a single HDR image that has a much larger dynamic range than a single exposure image. For instance, images of the same scene could be recorded at a series of different exposure times, where the longest exposure is set to optimally capture the dimmest portions of the scene and the shortest exposure is set to optimally capture the brightest portions of the scene. However, such image combination methods frequently suffer from artifacts caused, for example, by objects in the scene moving between exposures.

HDR color image sensors that capture an HDR color image in a single frame have been developed. One example hereof is an image sensor where every other row of the color pixel array operates at a shorter exposure time. Bright light data and low light data are obtained from the rows operating at the shorter exposure time and longer exposure times, respectively. Another example is an image sensor based on pixels that are characterized by a piecewise linear photoresponse curve. The photoresponse curve is composed of linear segments of different photoresponsivity. During exposure, the pixels are partially reset multiple times to acquire data corresponding to these different photoresponsivities. However, both of these sensors may still suffer artifacts associated with moving objects, as the time periods for acquiring data from different portions of the dynamic range are not identical.

SUMMARY

In an embodiment, a dual pixel-size color image sensor for capturing color images includes (a) an imaging surface, for imaging of incident light, and (b) a plurality of color pixels, each color pixel including (i) four large photosites, including two large first-color photosites sensitive to a first color of the incident light, and (ii) four small photosites including two small first-color photosites sensitive to the first color of the incident light. The large and small first-color photosites are arranged such that connected regions of the imaging surface, not associated with large first-color photosites and not associated with small first-color photosites, are not continuous straight lines.

In an embodiment, a dual pixel-size color image sensor for capturing color images includes (a) an imaging surface, for imaging of incident light, and (b) a plurality of color pixels, each color pixel including (i) four large photosites, including two large first-color photosites sensitive to a first color of the incident light, and (ii) four small photosites including two small first-color photosites sensitive to the first color of the incident light. The large and small first-color photosites are arranged such that connected regions of the imaging surface, not associated with large first-color photosites and not associated with small first-color photosites, have an area no greater than the area of two large first-color photosites and two small first-color photosites.

In an embodiment, a method for manufacturing a color filter array on an imaging surface of a dual pixel-size image sensor includes forming a first-color coating on first portions of the imaging surface to form large and small first-color photosites sensitive to a first color, wherein connected portions of the imaging surface, different from the first portions, are not continuous straight lines.

DETAILED DESCRIPTION OF THE EMBODIMENTS

Disclosed herein are dual pixel-size color image sensors for capture of HDR images. A color pixel of a typical Bayer-type image sensor is composed of two green photosites, one red photosite, and one blue photosite, sensitive to light from the green, red, and blue portions of the visible spectrum, respectively. The photosites are formed by applying a color filter array to an underlying pixel array. Each pixel of the underlying pixel array, together with a color filter of the color filter array, defines a photosite. In the presently disclosed dual pixel-size color image sensors, each color pixel is composed of two sets of photosites, where each set includes photosites of different colors. One set of photosites is more sensitive to light than the other set. The more sensitive set of photosites provide high-quality data for the dimmer portions of a scene, while the less sensitive set of photosites provide high-quality data for the brighter portions of the scene. This approach has the advantage that all data is acquired simultaneously. Therefore, the images are free from the motion-induced artifacts experienced in multiple-exposure based HDR imaging systems and other HDR imaging systems where the time periods for acquiring data from different portions of the dynamic range are not identical.

Several different layouts of the dual pixel-size color image sensor are disclosed together with methods for manufacturing associated color filter arrays. Manufacturing of dual pixel-size color image sensors is more challenging than that of conventional Bayer type image sensors, and images captured by such sensors often suffer from color striation artifacts introduced during the application of the color filters that define the color sensitivities of photosites. The thickness of the color filter array applied to an individual pixel of the underlying pixel array affects both the amount and spectral properties of light transmitted to the pixel. Proper color determination of the light incident on a color pixel, composed of photosites of different colors, relies on well-controlled application of color filters to each individual photosite. Certain embodiments disclosed herein are optimized to ease the requirements to process control during manufacturing of the color filter array and/or provide improved color definition in the captured HDR images.

Figure 1:
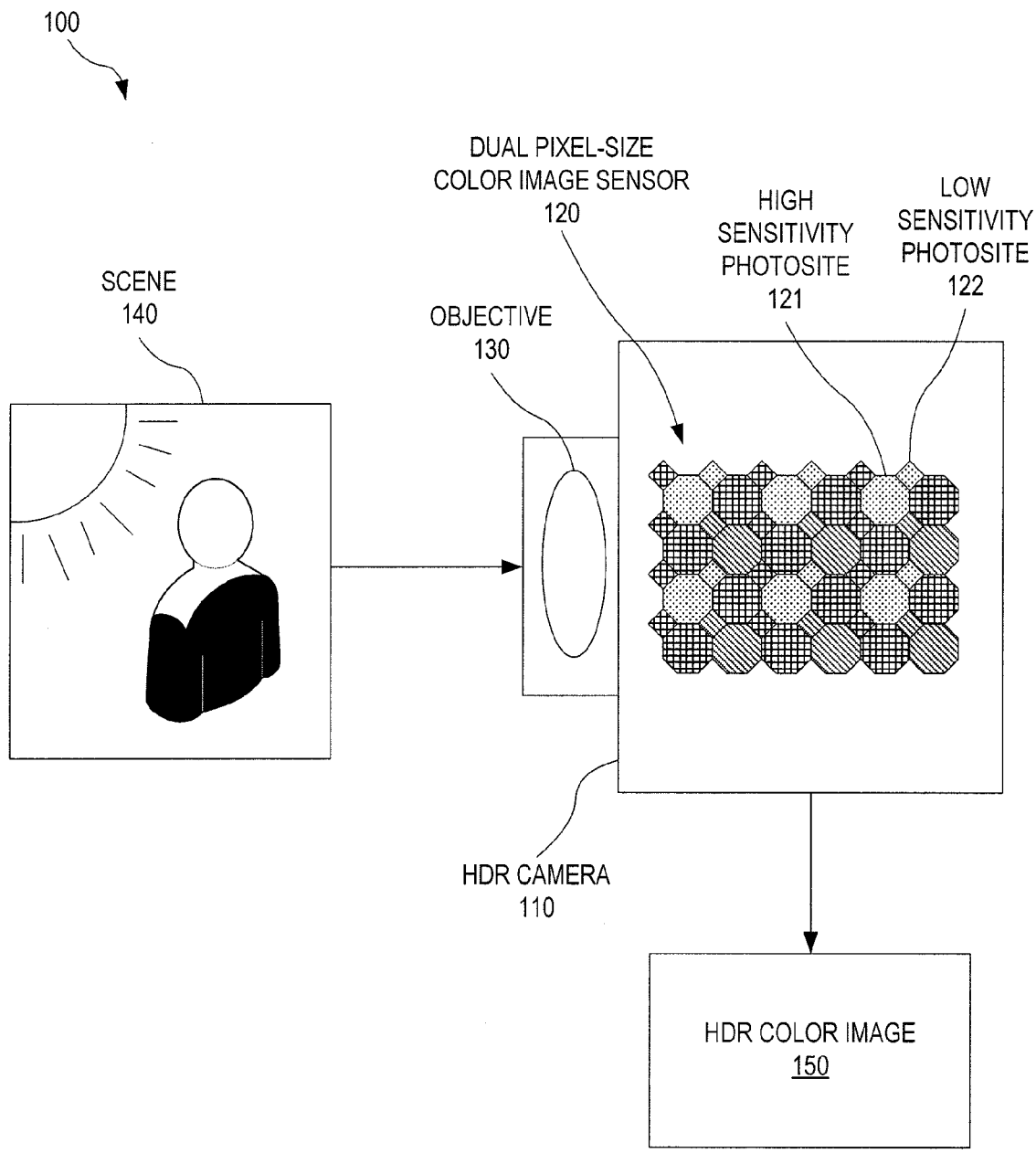
FIG. 1 illustrates a scenario where one exemplary HDR camera including one exemplary dual pixel-size color image sensor produces HDR images of a scene, according to an embodiment.

FIG. 1 illustrates a scenario 100, in which an HDR camera 110 captures images of a scene 140 to produce an HDR color image 150. HDR camera 110 includes a dual pixel-size color image sensor 120 and an objective 130 for forming an image of scene 140 onto dual pixel-size color image sensor 120. Dual pixel-size color image sensor 120 includes high-sensitivity photosites 121 (only one labeled in FIG. 1) and low-sensitivity photosites 122 (only one labeled in FIG. 1) of different colors. High sensitivity photosites 121 have a larger photosensitive area than low-sensitivity photosites 122 and are therefore more sensitive to light. Accordingly, high-sensitivity photosites 121 provide better data in low-light situations than low-sensitivity photosites 122. In bright-light situations, high-sensitivity photosites 121 may saturate and better data is obtained from low-sensitivity photosites 122. In the scenario illustrated in FIG. 1, scene 140 includes both bright-light portions, i.e., the sun and sunlit portions viewed by HDR camera 110, and low-light portions, i.e. the person backlit by the sun. The dynamic range of dual pixel-size color image sensor 120 enables capture of HDR color image 150 showing detail in both the bright, sunlit portions and the dim, backlit portions of scene 140. In comparison, a conventional non-HDR camera would likely fail to show good detail of the face of the backlit person.

Figure 2A:
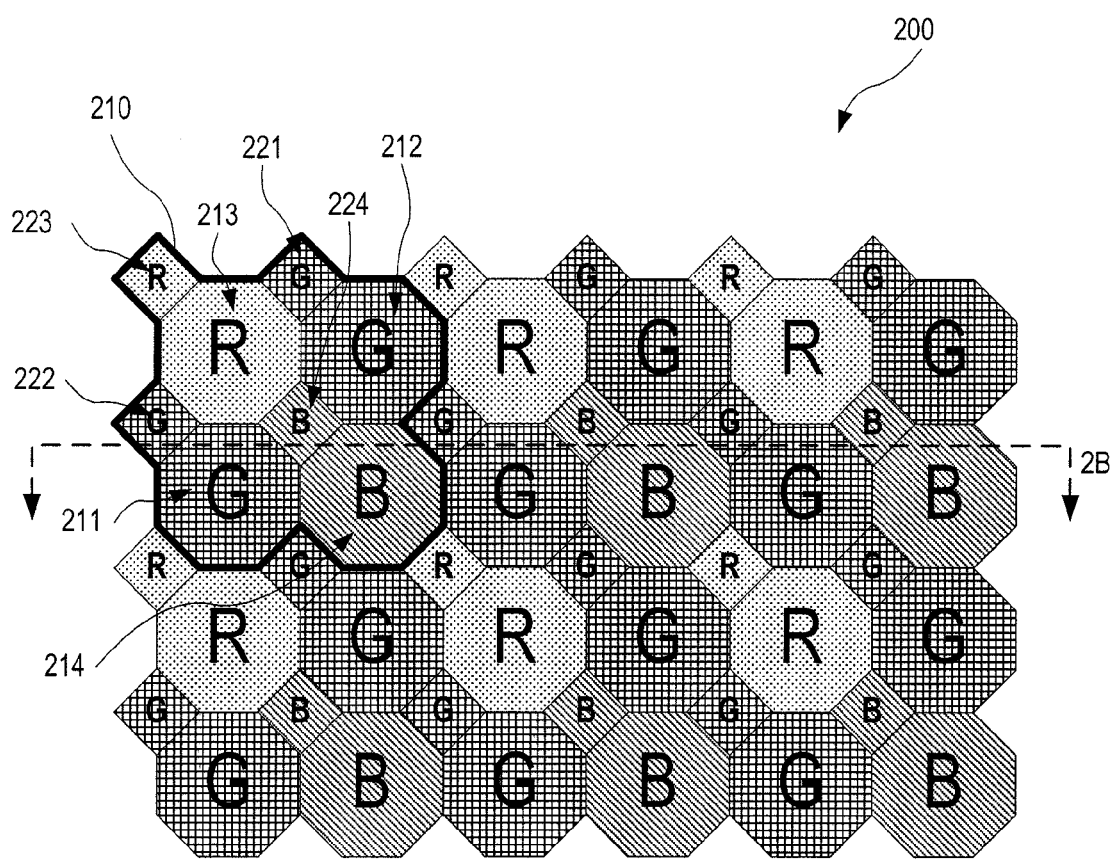
FIG. 2A illustrates, in top plan view, one exemplary dual pixel-size color image sensor, wherein each color pixel includes large photosites of three different colors and small photosites of three different colors, according to an embodiment.
Figure 2B:
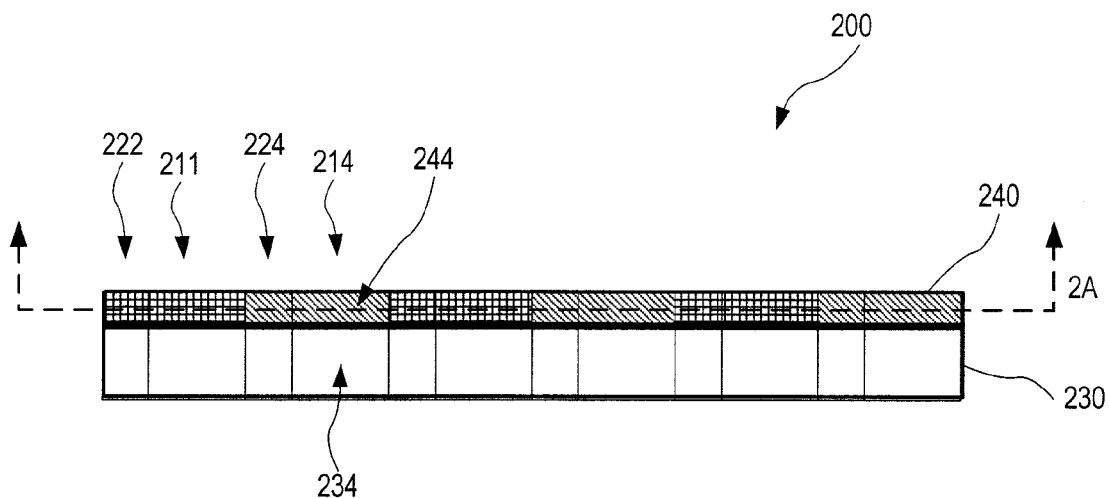
FIG. 2B illustrates the dual pixel-size color image sensor of FIG. 2A in elevational view.

FIGS. 2A and 2B illustrate a dual pixel-size color image sensor 200 in top plan and elevational view, respectively. FIGS. 2A and 2B are best viewed together. Dual pixel-size color image sensor 200 is an embodiment of dual pixel-size color image sensor 120 of FIG. 1. As illustrated in FIG. 2B, dual pixel-size color image sensor 200 includes an underlying pixel array 230 and a color filter array 240. As illustrated in FIG. 2A, dual pixel-size color image sensor 200 includes a plurality of identical color pixels 210 (only one labeled in FIG. 2A). Each color pixel 210 includes four large photosites and four small photosites. The four large photosites include two green photosites 211 and 212, a red photosite 213, and a blue photosite 214, which are embodiments of high-sensitivity photosites 121 of FIG. 1. The four small photosites include two green photosites 221 and 222, a red photosite 223, and a blue photosite 224, which are embodiments of low-sensitivity photosites 122 of FIG. 1. Each of large photosites 211-214 is formed by applying a color filter to a large pixel of an underlying pixel array of dual pixel-size image sensor 200. This is illustrated for photosite 214 in FIG. 2B where photosite 214 is formed from a pixel 234 of underlying pixel array 230 and a color filter 244 of color filter array 240. Equivalently, each of small photosites 221-224 is formed by applying a color filter of color filter array 240 to a small pixel of an underlying pixel array of dual pixel-size image sensor 200. Large green photosites, 211 and 212, and small green photosites, 221 and 222, include a color filter of color filter array 240 that transmits light in the green portion of the visible spectrum. Large red photosite 213 and small red photosite 223 include a color filter of color filter array 240 that transmits light in the red portion of the visible spectrum. Large blue photosite 214 and small blue photosite 224 include a color filter of color filter array 240 that transmits light in the blue portion of the visible spectrum. This composition may be based on other colors than red, green, and blue, without departing from the scope hereof. Any three colors covering each their portion of a desired spectral range may replace the red, green, and blue colors of dual pixel-size color image sensor 200. For example, yellow may replace green, cyan may replace blue, and magenta may replace red.

In an embodiment, underlying pixel array 230 is a charge-couple device (CCD). In another embodiment, underlying pixel array 230 is a complementary metal-oxide-semiconductor (CMOS) image sensor.

Figure 3:
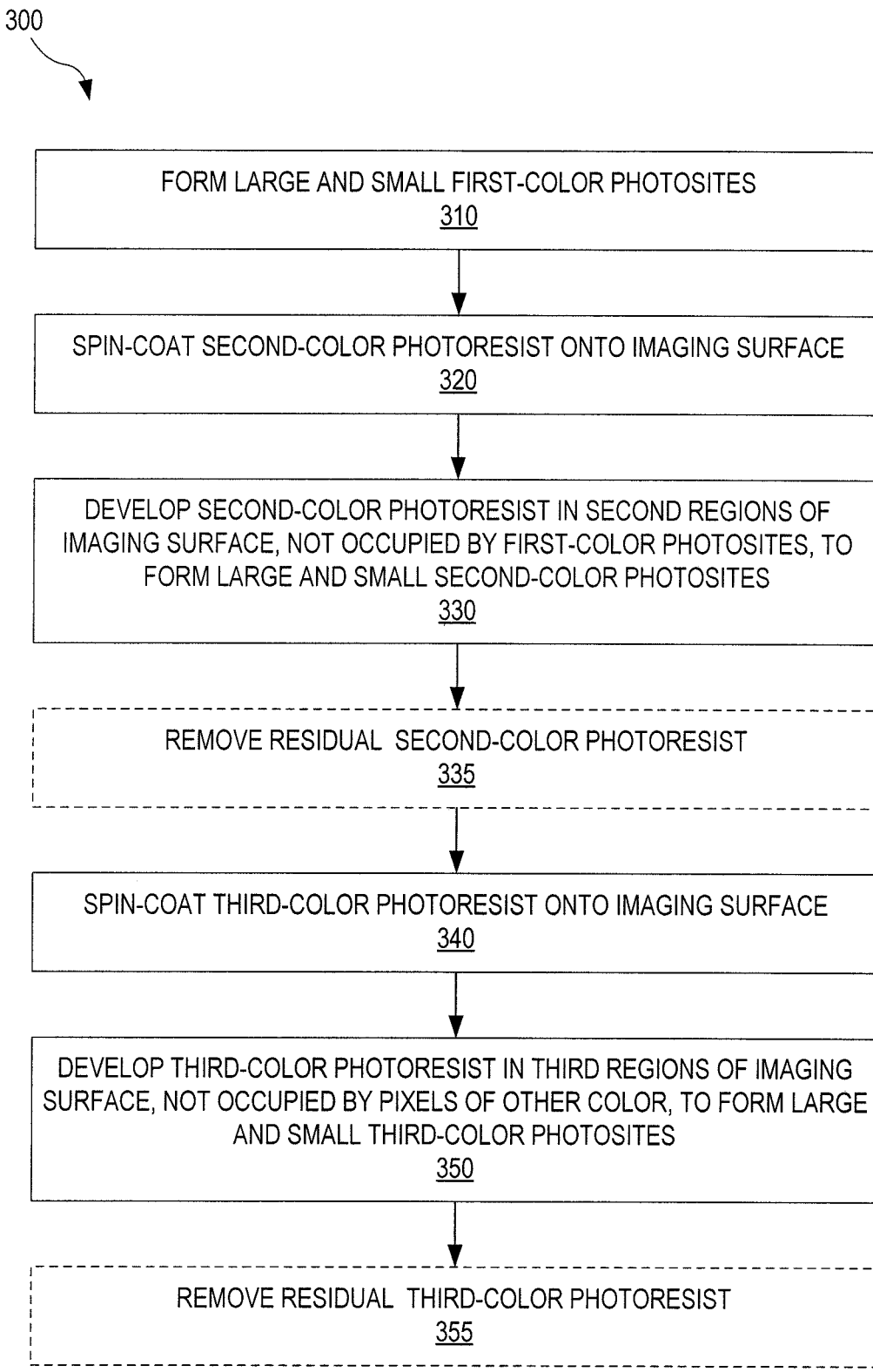
FIG. 3 illustrates one exemplary method for manufacturing a color filter array of a dual pixel-size color image sensor, according to an embodiment.

FIG. 3 illustrates a method 300 for manufacturing color filters for a dual pixel-size color image sensor to form photosites. Method 300 may be used to manufacture the color filter of dual pixel-size color image sensor 200 of FIG. 2 to form photosites 211-214 and 221-224. In a step 310, large and small photosites of a first color are formed. For example, step 310 forms large green photosites, 211 and 212, and small green photosites, 221, and 222, of dual pixel-size color image sensor 200 (FIG. 2). In an embodiment, step 310 includes (a) spin coating a first-color photoresist, e.g., green photoresist, onto the imaging surface of the dual pixel-size color image sensor, e.g., dual pixel-size color image sensor 200 (FIG. 2), (b) developing the first-color photoresist in desired portions of the imaging surface, and (c) cleaning off residual photoresist.

In a step 320, a photoresist of a second color is spin coated onto the imaging surface of the dual pixel-size color image sensor. For example, red photoresist is spin coated onto the imaging surface of dual pixel-size color image sensor 200 (FIG. 2). In a step 330, the second-color photoresist is developed in second regions of the imaging surface to form large and small photosites of the second color. The second regions of the imaging surface are located in portions of the imaging surface not occupied by the first-color photosites formed in step 310. For example, red photoresist is developed to form large red photosite 213 and small red photosite 223 of dual pixel-size color image sensor 200 (FIG. 2). In an optional step 335, residual second-color photoresist is removed from the imaging surface of the dual pixel-size color image sensor, e.g., residual red photoresist is cleaned off of the imaging surface of dual pixel-size color image sensor 200 (FIG. 2).

In a step 340, a photoresist of a third color is spin coated onto the imaging surface of the dual pixel-size color image sensor. For example, blue photoresist is spin coated onto the imaging surface of dual pixel-size color image sensor 200 (FIG. 2). In a step 350, the third-color photoresist is developed in third regions of the imaging surface to form large and small photosites of the third color. The third regions of the imaging surface are portions of the imaging surface not occupied by photosites of other colors formed in steps 310 and 330. For example, blue photoresist is developed to form large blue photosite 214 and small blue photosite 224 of dual pixel-size color image sensor 200 (FIG. 2). In an optional step 355, residual third-color photoresist is removed from the imaging surface of the dual pixel-size color image sensor, e.g., residual blue photoresist is cleaned off of the imaging surface of dual pixel-size color image sensor 200 (FIG. 2).

Figure 4:
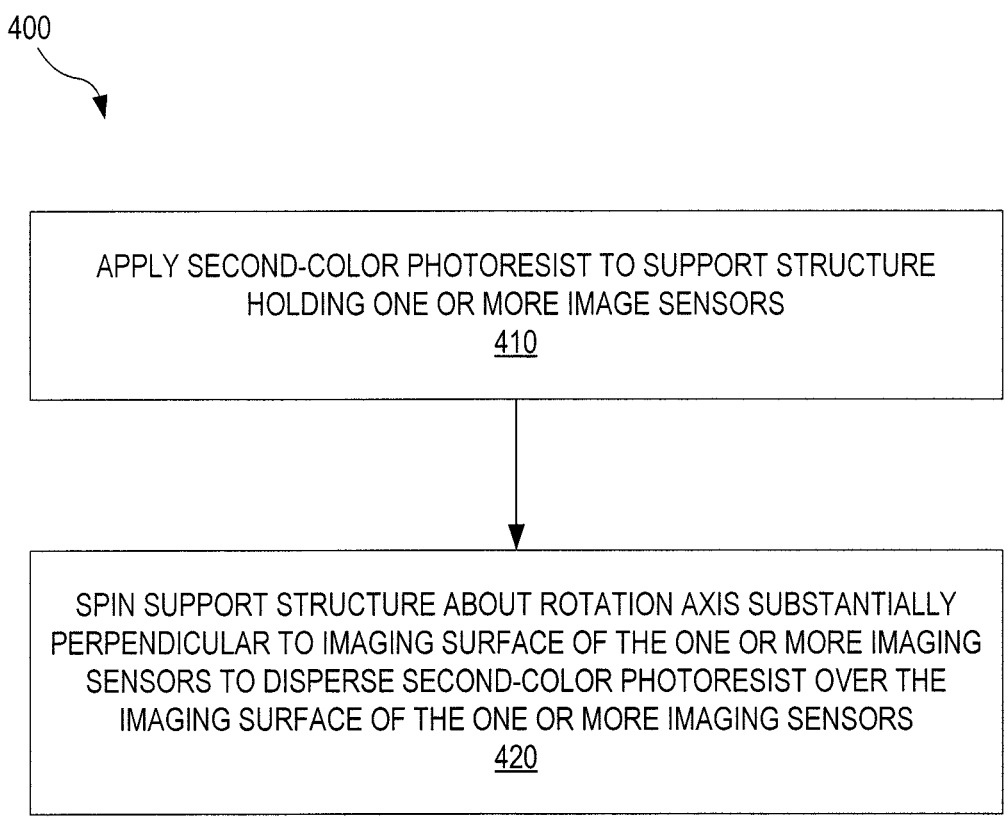
FIG. 4 illustrates one exemplary embodiment of a photoresist spin coating step of the method illustrated in FIG. 3, according to an embodiment.

FIG. 4 illustrates a method 400, which is an embodiment of step 320 of method 300 (FIG. 3). Method 400 includes steps 410 and 420. In step 410, the second-color photoresist is applied to a support structure holding one or more image sensors. In an embodiment, the support structure is a wafer holding a plurality of image sensors, e.g., 10-10000 image sensors. The second-color photoresist may be applied to a local area of the support structure. This local area may contain an image sensor, in which case the second-color photoresist is applied to the image surface of the image sensor. Alternatively, the local area may not contain an image sensor, and the second-color photoresist is applied directly to the support structure. In an embodiment, the second-color photoresist is applied to a location near the center of the support structure. In step 420, the support structure is spun about a rotation axis that is substantially perpendicular to the imaging surface of the one or more image sensors held by the support structure. The rotation causes the second-color photoresist to flow on the surface of the support structure, and/or image sensors held by the support structure, in a direction away from the rotation axis. By proper tuning of the rotation rate, second-color photoresist viscosity, and surface energies, the second-color photoresist is dispersed over the image surfaces of the one or more image sensors held by the support structure. Method 400 may be extended to apply to step 340 of method 300 (FIG. 3).

Figure 5:
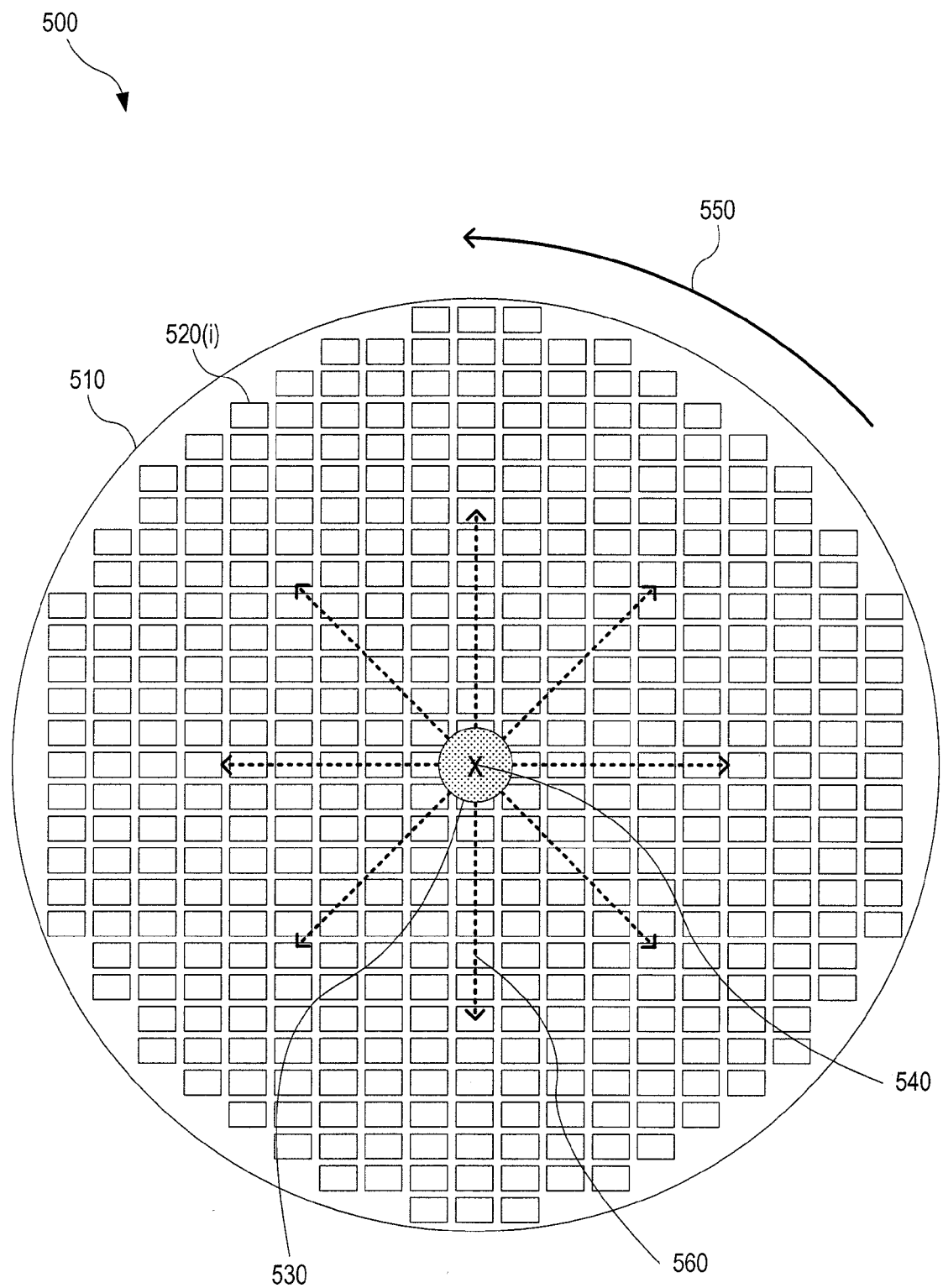
FIG. 5 is a diagram illustrating the method of FIG. 4 applied to multiple image sensors, according to an embodiment.

FIG. 5 is a diagram 500 illustrating method 400 of FIG. 4 in an embodiment where multiple image sensors are spin-coated with second-color photoresist. A support structure 510 holds a plurality of image sensors 520 (i) (only one labeled in FIG. 5). FIG. 5 shows support structure 510 and image sensors 520(i) in top plan view. In step 410 of method 500, second-color photoresist is applied to a local area 530 of support structure 510. In step 420 of method 500, the support structure is spun about a rotation axis 540 in a direction 550. Rotation axis 540 is perpendicular to the plane of support structure 510, and the imaging surfaces of image sensors 520(i). In this embodiment, local area 530 and rotation axis 540 are centered on support structure 510. As support structure 510 spins about rotation axis 540, the second-color photoresist disperses from local area 540 in a radially outward direction indicated by arrows 560 (only one arrow labeled in FIG. 5). This results in coating of the imaging surfaces of image sensors 520(i), as well as exposed portions of the surface of support structure 510.

Figure 6:
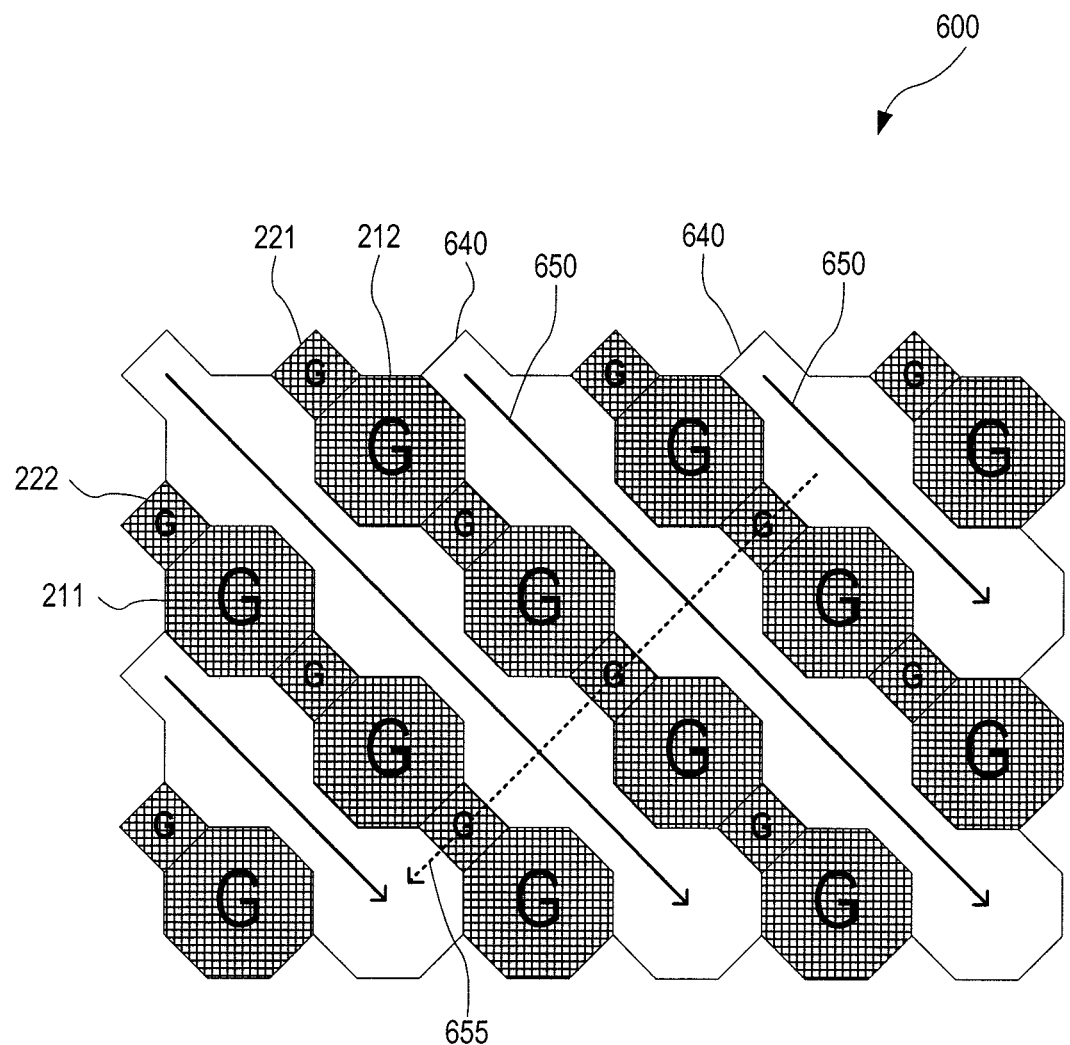
FIG. 6 is a diagram illustrating the state of the dual pixel-size color image sensor of FIG. 2 during manufacturing, according to an embodiment.

FIG. 6 is a diagram 600 illustrating the state of dual pixel-size color image sensor 200 of FIG. 2 during manufacturing, after performing step 310 of method 300 (FIG. 3). At this point in the manufacturing process, dual pixel-size color image sensor 200 (FIG. 2) includes fully formed, large green photosites, e.g., large green photosites 211 and 212 (FIG. 2), and fully formed, small green photosites, e.g., small green photosites 221 and 222 (FIG. 2). The portions of the imaging surface of dual pixel-size color image sensor 200, not associated with large or small green photosites, include connected regions 640 (two labeled in FIG. 6). These connected regions are continuous straight lines. Since the color filters included in the large and small green photosites have a finite thickness, the connected regions not associated with large or small green photosites are shallow linear channels. These channels are separated from each other by connected linear regions of large and small green photosites. In the following manufacturing step, step 320 of method 300 (FIG. 3), a second-color photoresist, e.g., red photoresist, is spin coated onto the imaging surface of dual pixel-size color image sensor 200. In this step, the resistance to flow of photoresist across the imaging surface may be less for flow through the channels, as indicated by arrows 650, than for flow in a direction across both channels and regions of large and small green photosites, as indicated by arrow 655.

Figure 7:
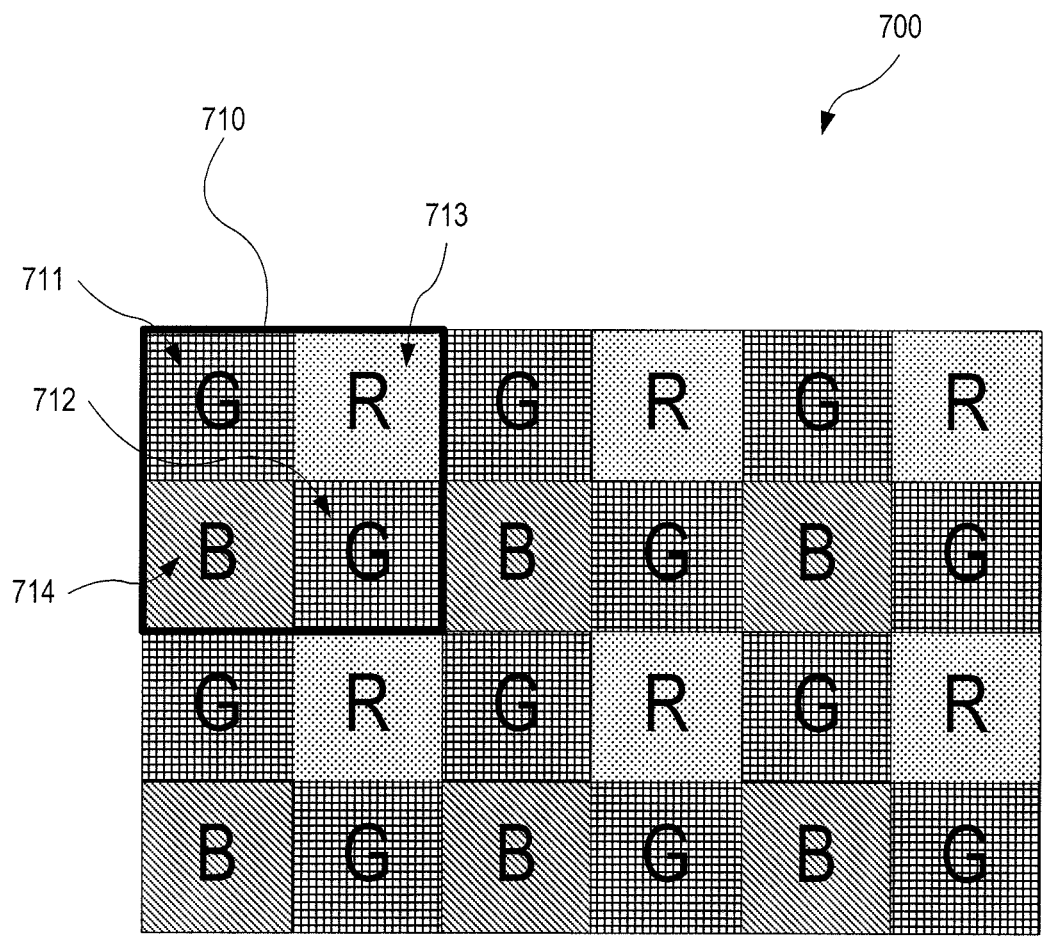
FIG. 7 illustrates a conventional color image sensor with a Bayer color filter.

FIG. 7 illustrates a conventional non-HDR image sensor 700 with a Bayer color filter array. Image sensor 700 includes a plurality of identical color pixels 710 (only one labeled in FIG. 7). Each color pixel 710 is composed of four identically sized photosites: two green photosites 711 and 712, one red photosite 713, and one blue photosite 714. Image sensor 700 may be manufactured according to a process wherein the green photosites are formed before the red and blue photosites. In this case, there are no connected regions, not associated with green photosites, of size greater than a single photosite. Accordingly, no channels are formed between the green photosites and the resistance to flow of photoresist on the surface, during application of the second-color photoresist, is not expected to have a significant directional dependence. As a result, the spin coating processes applied in the manufacturing of the color filter array of image sensor 700 do not need to account for a directionally dependent resistance to fluid flow.

Figure 8:
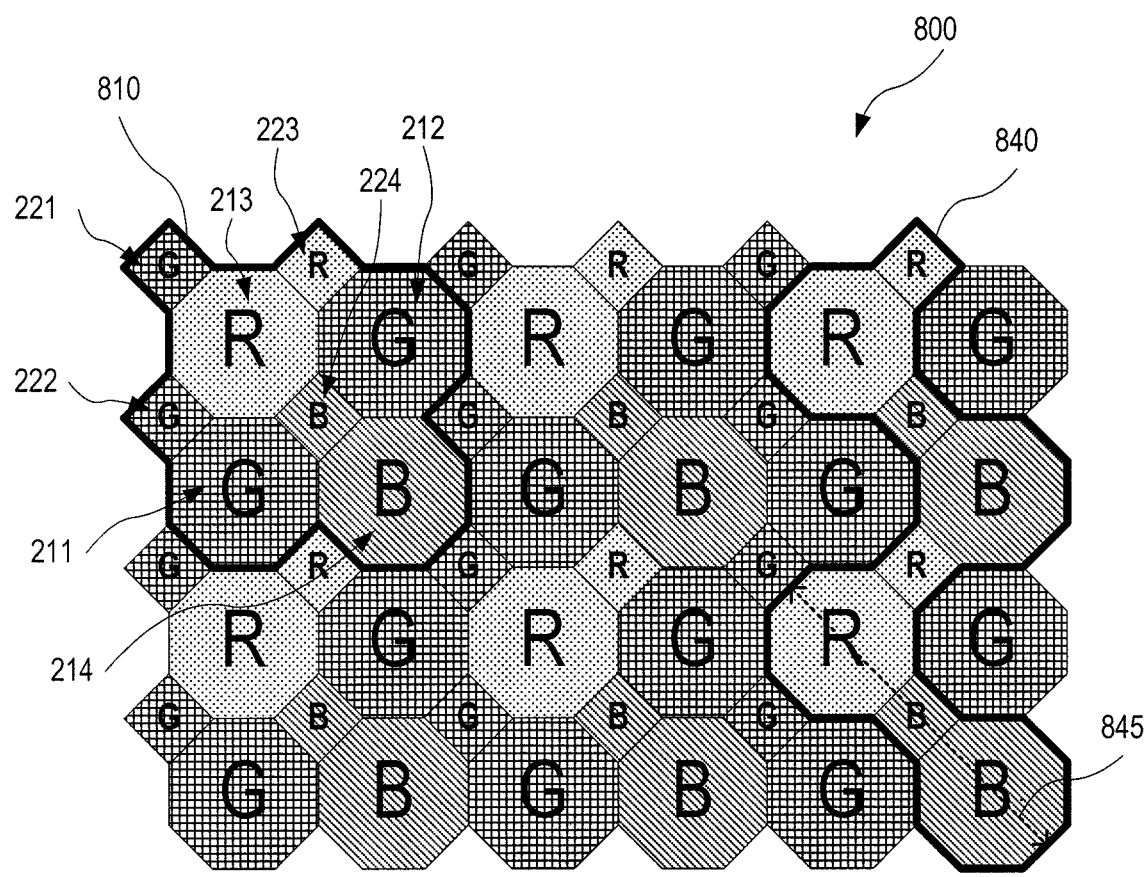
FIG. 8 illustrates, in top plan view, one exemplary dual pixel-size color image sensor, wherein connected regions of the imaging surface, not associated with large or small green photosites, do not form continuous straight lines, according to an embodiment.

FIG. 8 illustrates a dual pixel-size color image sensor 800 in top plan view, which is another embodiment of dual pixel-size color image sensor 120 of FIG. 1. Dual pixel-size color image sensor 800 is identical to dual pixel-size color image sensor 200 of FIG. 2, except for trading the location of small green photosite 221 with that of small red photosite 223 as compared to dual pixel-size color image sensor 200 (FIG. 2). The color filter array of dual pixel-size color image sensor 800 is configured such that connected regions 840 of the imaging surface, not associated with large or small green photosites, do not form continuous straight lines (one connected region 840 is indicated in FIG. 8). Connected regions 840 include connected linear segments 845 (one linear segment 845 labeled in FIG. 8). Each linear segment 845 has a length no greater than the length of two large photosites, e.g., large green photosites, and one small photosite, e.g., a small green photosite. Each linear segment 845 includes at most two large photosites and one small photosite, all of a color different from green. For example, a linear segment 845 may be composed of a large red photosite, a small blue photosite, and a large blue photosite.

This color composition of dual pixel-size color image sensor 800 may be based on other colors than red, green, and blue, without departing from the scope hereof. Any three colors covering each their portion of a desired spectral range may replace the red, green, and blue colors of dual pixel-size color image sensor 800. For example, yellow may replace green, cyan may replace blue, and magenta may replace red.

Figure 9:
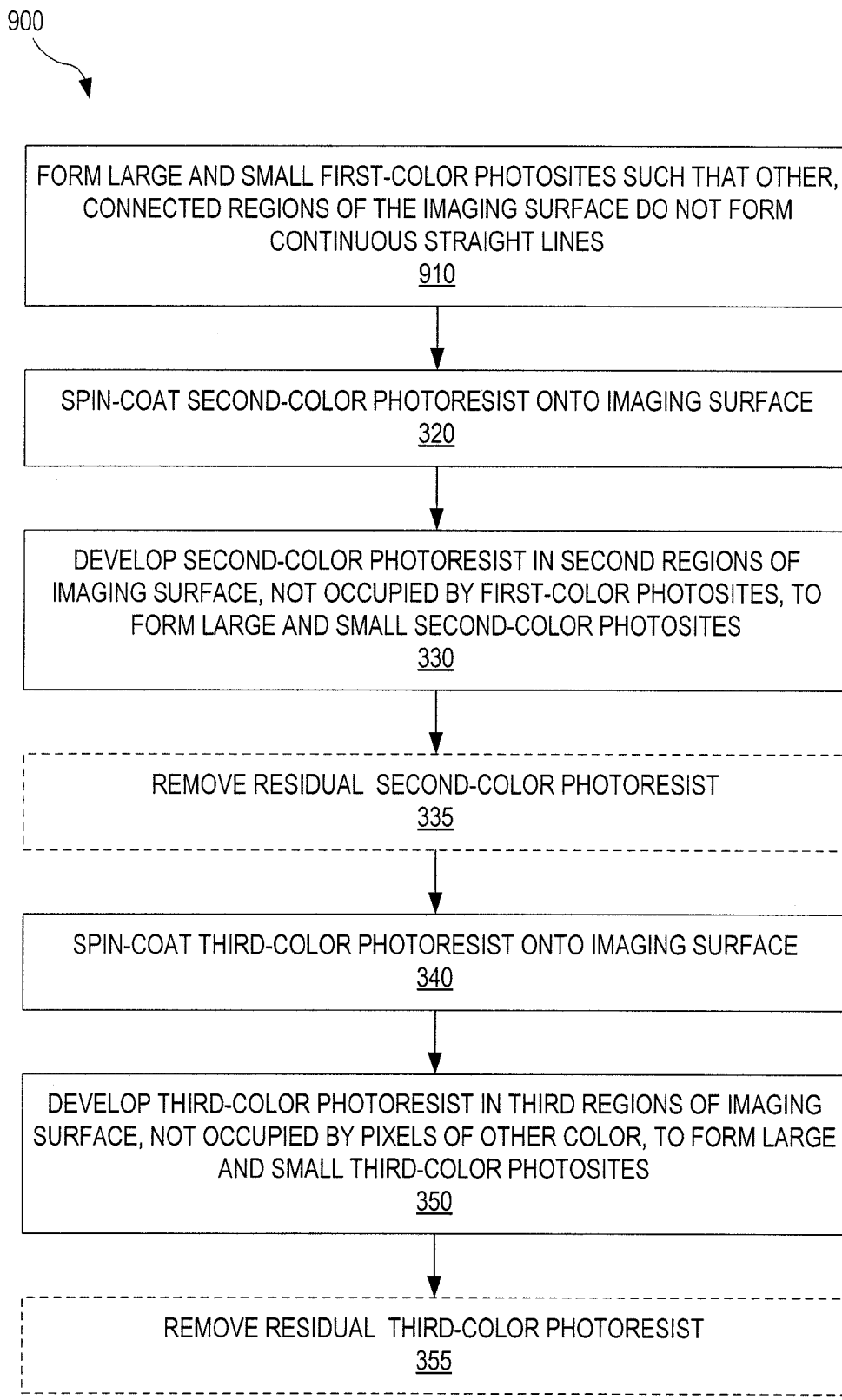
FIG. 9 illustrates one exemplary method for manufacturing a color filter array of a dual pixel-size color image sensor, wherein connected regions of the imaging surface, not associated with large or small first-color photosites, do not form continuous straight lines, according to an embodiment.

FIG. 9 illustrates a method 900 for manufacturing a color filter array of a dual pixel-size color image sensor. Method 900 is an embodiment of method 300 of FIG. 3 and is, for example, used to manufacture dual pixel-size color image sensor 800 of FIG. 8. Method 900 is identical to method 300 of FIG. 3, except that step 310 of method 300 (FIG. 3) is replaced by a step 910. In step 910, large and small photosites of a first color are formed such that connected regions of the imaging surface, not associated with first-color photosites, do not form continuous straight lines. For example, large green photosites, 211 and 212, and small green photosites, 221 and 222, of dual pixel-size color image sensor 800 are formed such that connected regions 840 are not continuous straight lines.

Figure 10:
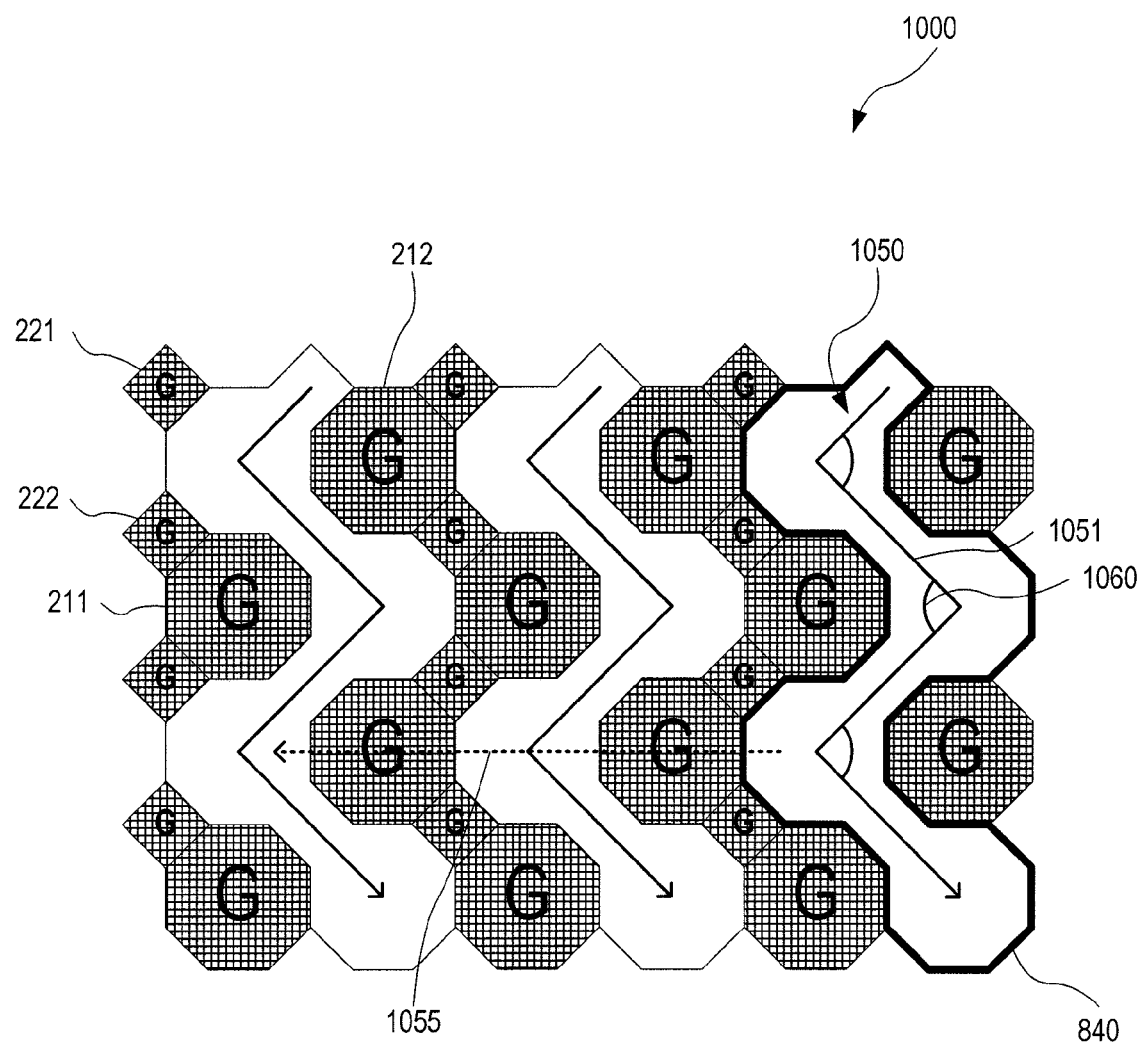
FIG. 10 is a diagram illustrating the state of the dual pixel-size color image sensor of FIG. 8 during manufacturing, after forming the large and small green photosites, according to an embodiment.

FIG. 10 is a diagram 1000 illustrating the state of dual pixel-size color image sensor 800 of FIG. 8 during manufacturing, after performing step 910 of method 900 (FIG. 9). At this point in the manufacturing process, dual pixel-size color image sensor 800 (FIG. 8) includes fully formed, large green photosites, e.g., large green photosites 211 and 212 (FIG. 8), and fully formed, small green photosites, e.g., small green photosites 221 and 222 (FIG. 8). The portions of the imaging surface of dual pixel-size color image sensor 800, not associated with large or small green photosites, include connected regions 840. Since the color filters included in the large and small green photosites have a finite thickness, connected regions 840 are shallow channels. In the following manufacturing step, step 320 of method 900 (FIG. 9), a second-color photoresist, e.g., red photoresist, is spin coated onto the imaging surface of dual pixel-size color image sensor 800.

In comparison to the channels formed by connected regions 640 (FIG. 6) of dual pixel-size color image sensor 200 (FIG. 2), the channels formed by connected regions 840 are not straight continuous lines. As illustrated in FIG. 10, connected regions 840 are composed of linear segments 1051 that are connected to each other in series (only one linear segment labeled in FIG. 10). Linear segments 1051 of a pair of connected linear segments are arranged to be non-parallel, i.e., each pair of connected linear segments 1051 are at a relative angle 1060 to each other (only one relative angle labeled in FIG. 10). Relative angle 1060 is greater than 0° and smaller than 180°. In an embodiment, relative angle 1060 is a right angle. In another embodiment, relative angle 1060 is in the range between 80° and 100°.

An arrow 1050 indicates flow of photoresist through connected region 840. As compared to the continuous straight linear channels formed by connected regions 640 (FIG. 6) of dual pixel-size color image sensor 200, relative angle 1060 introduces added resistance to flow in the channels formed by connected regions 840. A direction 1055 of photoresist flow is perpendicular to the general direction of photoresist flow, approximately along arrow 1050, in the channels formed by connected regions 840. Direction 1055 is across both connected regions of large and small green photosites and connected regions 840. Direction 1055 is perpendicular to the direction of flow along arrow 1050 as averaged over many linear segments 1051. Due to the added resistance introduced by relative angle 1060, the difference in resistance to photoresist flow along direction 1050 and within the channels formed by connected regions 840, is less than the difference in resistance to photoresist flow along arrows 650 and 655 of FIG. 6. In an embodiment the resistance to flow of photoresist is the substantially the same in direction 1055 as within the channels formed by connected regions 840. Consequently, dispersion of second-color photoresist across the imaging surface, or a plurality of imaging surfaces processed together as discussed in connection with FIGS. 4 and 5, to form a uniform coating of second-color photoresist, e.g., red photoresist, is more easily achieved in step 320 of method 900 (FIG. 9). This relaxes the requirements to the process control necessary to achieve a desired coating thickness and coating thickness uniformity of the second-color photoresist for dual pixel-size color image sensor 800, as compared to dual pixel-size color image sensor 200 manufactured according to method 300 (FIG. 3).

When subsequently coating third-color photoresist, i.e., blue photoresist, onto the imaging surface of dual pixel-size color image sensor 800, the connected regions of the imaging surface, not associated with other-color photosites, have an area no greater than the area of a large photosite and a small photosite. Therefore, the resistance to flow of photoresist across the imaging surface is substantially identical in all directions. Accordingly, uniform coating of third-color photoresist of the imaging surface of dual pixel-size color image sensor 800 may be achieved in step 340 of method 900 (FIG. 9) without having to account for any directional dependence in fluid flow resistance.

Figure 11:
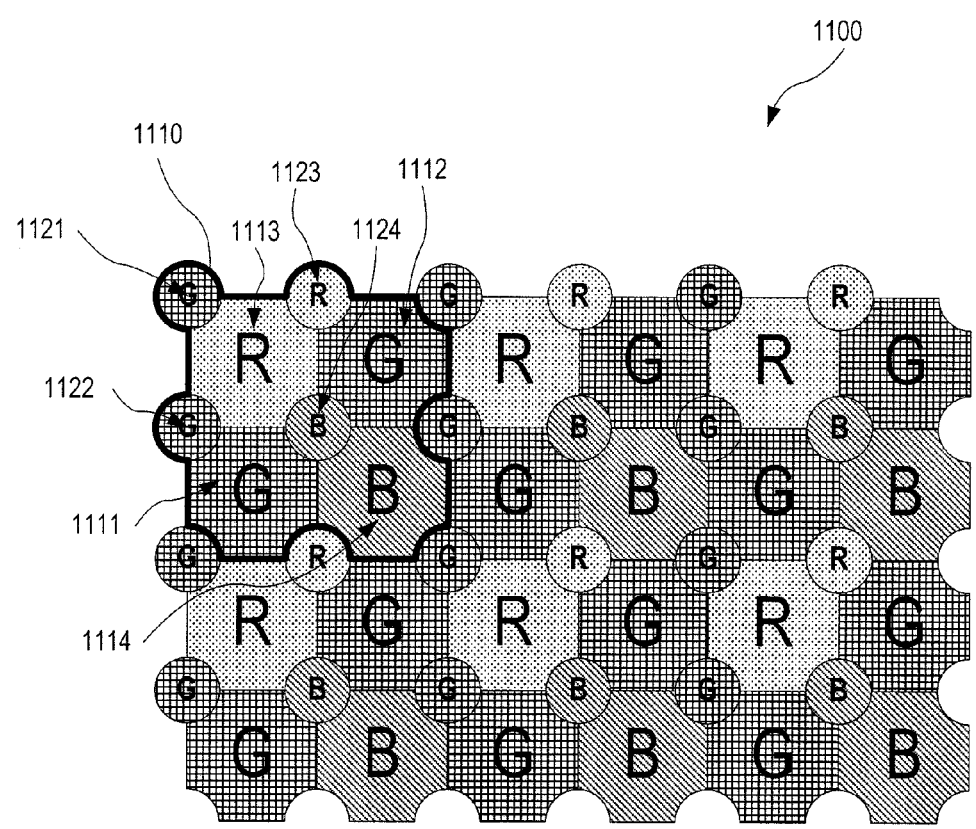
FIG. 11 illustrates, in top plan view, one exemplary dual pixel-size color image sensor, wherein connected regions of the imaging surface, not associated with large or small green photosites, do not form continuous straight lines, according to an embodiment.

FIG. 11 illustrates, in top plan view, a dual pixel-size color image sensor 1100, which is an example of an extension of dual pixel-size color image sensor 800 to different photosite shapes. Dual pixel-size color image sensor 1100 is an embodiment of dual pixel-size color image sensor 120 of FIG. 1. Dual pixel-size color image sensor 1100 includes a plurality of identical color pixels 1010. Each color pixel 1110 includes four large photosites and four small photosites. The four large photosites include two green photosites 1111 and 1112, a red photosite 1113, and a blue photosite 1114, which are embodiments of high-sensitivity photosites 121 of FIG. 1. The four small photosites include two green photosites 1121 and 1122, a red photosite 1123, and a blue photosite 1124, which are embodiments of low-sensitivity photosites 122 of FIG. 1. The small photosites of dual pixel-size color image sensor 1100 are circular, and the large photosites are shaped as squares with a quarter-circular cutout at each corner. Dual pixel-size color image sensor 1100 may be manufactured according to method 900 of FIG. 9. The discussion of dual pixel-size color image sensor 800 (FIG. 8) is extended to dual pixel-size color image sensor 1100 and other dual pixel-size color image sensors that are merely a version of dual pixel-size color image sensor 800 with different photosite shapes.

Figure 12:
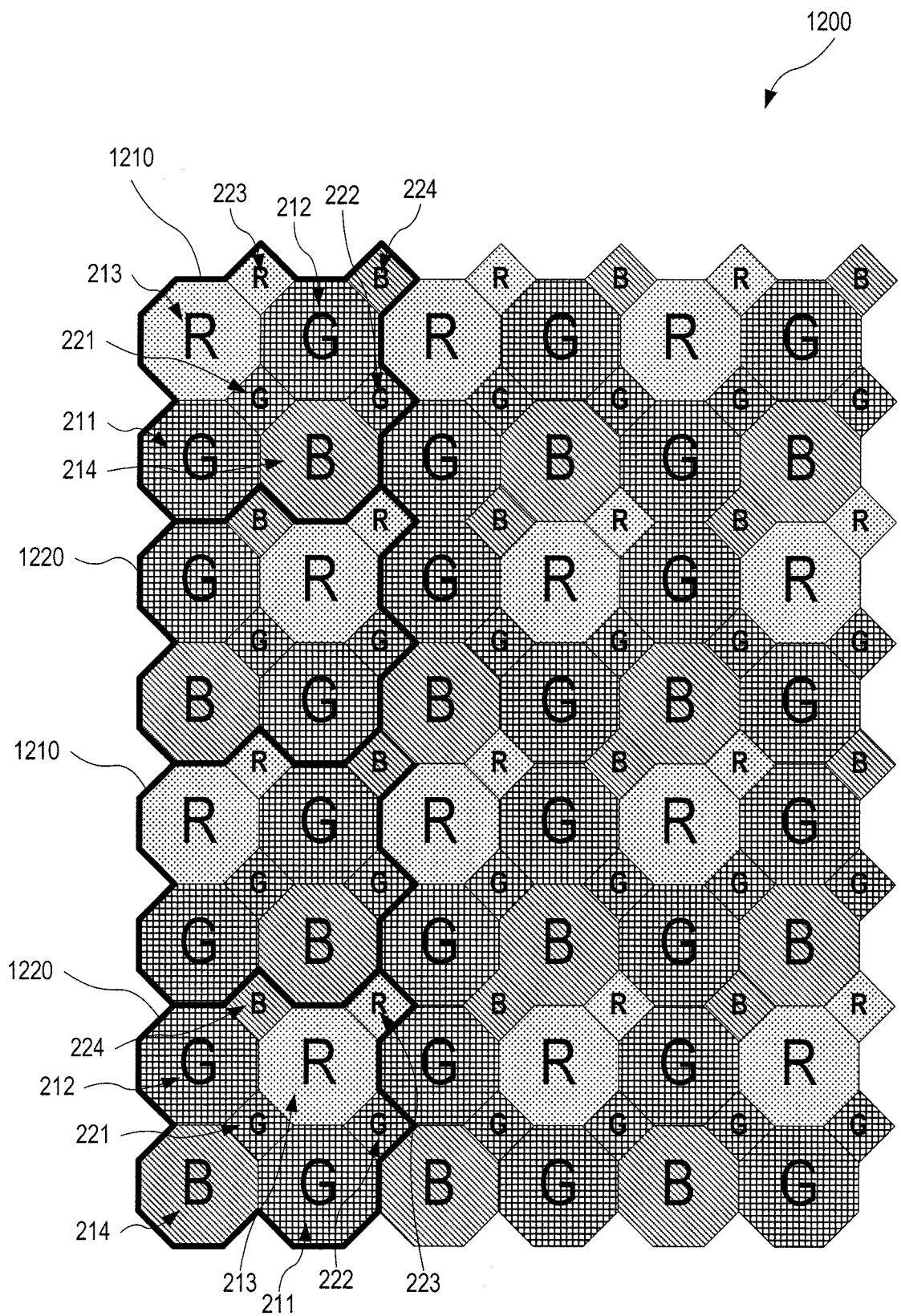
FIG. 12 illustrates, in top plan view, one exemplary dual pixel-size color image sensor, wherein connected regions of the imaging surface, not associated with large or small green photosites, have an area no greater than the area of two large and two small photosites, according to an embodiment.

FIG. 12 illustrates, in top plan view, a dual pixel-size color image sensor 1200, which is an embodiment of dual pixel-size color image sensor 120 of FIG. 1. Dual pixel-size color image sensor 1200 is identical to dual pixel-size color image sensor 200 of FIG. 2 except for the photosites being arranged differently. Dual pixel-size color image sensor 1200 includes a plurality of identical first-type color pixels 1210 and a plurality of identical second-type color pixels 1220. Rows of color pixels alternate between rows composed of first type color pixels 1210 and rows composed of second-type color pixels 1220. Each first-type color pixel 1210 and each second-type color pixel 1220 includes four large photosites and four small photosites. The four large photosites include green photosites 211 and 212, red photosite 213, and blue photosite 214, which are embodiments of high-sensitivity photosites 121 of FIG. 1. The four small photosites include two green photosites 221 and 222, a red photosite 223, and a blue photosite 224, which are embodiments of low-sensitivity photosites 122 of FIG. 1. The photosites of second-type color pixel 1220 are arranged differently from the photosites of first-type color pixel 1210. Compared to first-type color pixel 1210, large green photosite 211 and large blue photosite 214 have traded places in second-type color pixel 1220, large green photosite 212 and large red photosite 213 have traded places in second-type color pixel 1220, and small blue photosite 224 and small red photosite 223 have traded places in second-type color pixel 1220.

Connected regions of the imaging surface of dual pixel-size color image sensor 1200, not associated with large green photosites, 211 or 212, or small green photosites, 221 or 222, have an area no greater than the area of two large green photosites, 211 or 212, and two small green photosites, 221 or 222. The connected regions of dual pixel-size color image sensor 1200 include at most two large photosites and two small photosites. In interior regions of the imaging surface of dual pixel-size color image sensor 1200, the connected regions are composed of a large red photosite 213, a large blue photosite 214, a small red photosite 223, and small blue photosite 224.

This color composition of dual pixel-size color image sensor 1200 may be based on other colors than red, green, and blue, without departing from the scope hereof. Any three colors covering each their portion of a desired spectral range may replace the red, green, and blue colors of dual pixel-size color image sensor 1200. For example, yellow may replace green, cyan may replace blue, and magenta may replace red.

Figure 13:
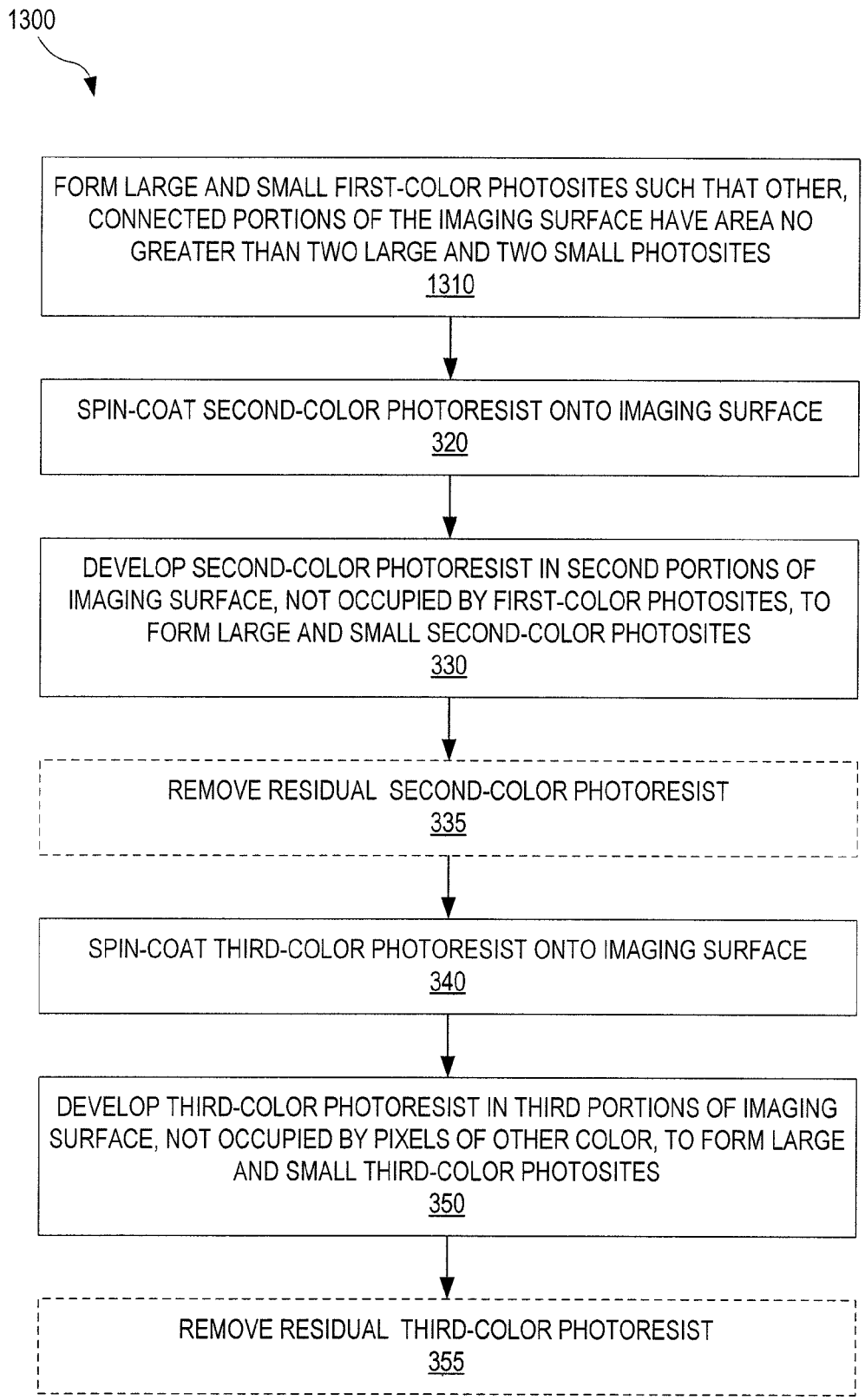
FIG. 13 illustrates one exemplary method for manufacturing a color filter array of a dual pixel-size color image sensor such that connected regions of the imaging surface, not associated with large or small first-color photosites, have an area no greater than the area of two large and two small first-color photosites, according to an embodiment.

FIG. 13 illustrates a method 1300 for manufacturing a dual pixel-size color image sensor. Method 1300 is an embodiment of method 300 of FIG. 3 and is used to manufacture, for example, the color filter array of dual pixel-size color image sensor 1200 of FIG. 12. Method 1300 is identical to method 300 of FIG. 3, except that step 310 of method 300 (FIG. 3) is replaced by a step 1310. In step 1310, large and small first-color pixels are formed such that connected regions of the imaging surface, not associated with large or small first-color photosites, have an area no greater than the area of two large first-color photosites and two small first-color photosites. For example, large green photosites, 211 and 212, and small green photosites, 221 and 222, of dual pixel-size color image sensor 1200 (FIG. 12) are formed such that connected regions of the imaging surface of dual pixel-size color image sensor 1200 have an area no greater than the area of two large green photosites, 211 or 212, or two small green photosites, 221 or 222.

When manufacturing dual pixel-size color image sensor 1200 of FIG. 12 according to method 1300 of FIG. 13, the resistance to flow of both second-color photoresist and third-color photoresist, i.e., red photoresist and blue photoresist, across the imaging surface is substantially uniform in all directions. Consequently, uniform coating of the imaging surface with red and blue photoresist may be achieved in steps 320 and 340 of method 1300 without the need to account for directional differences in fluid flow resistance.

Figure 14:
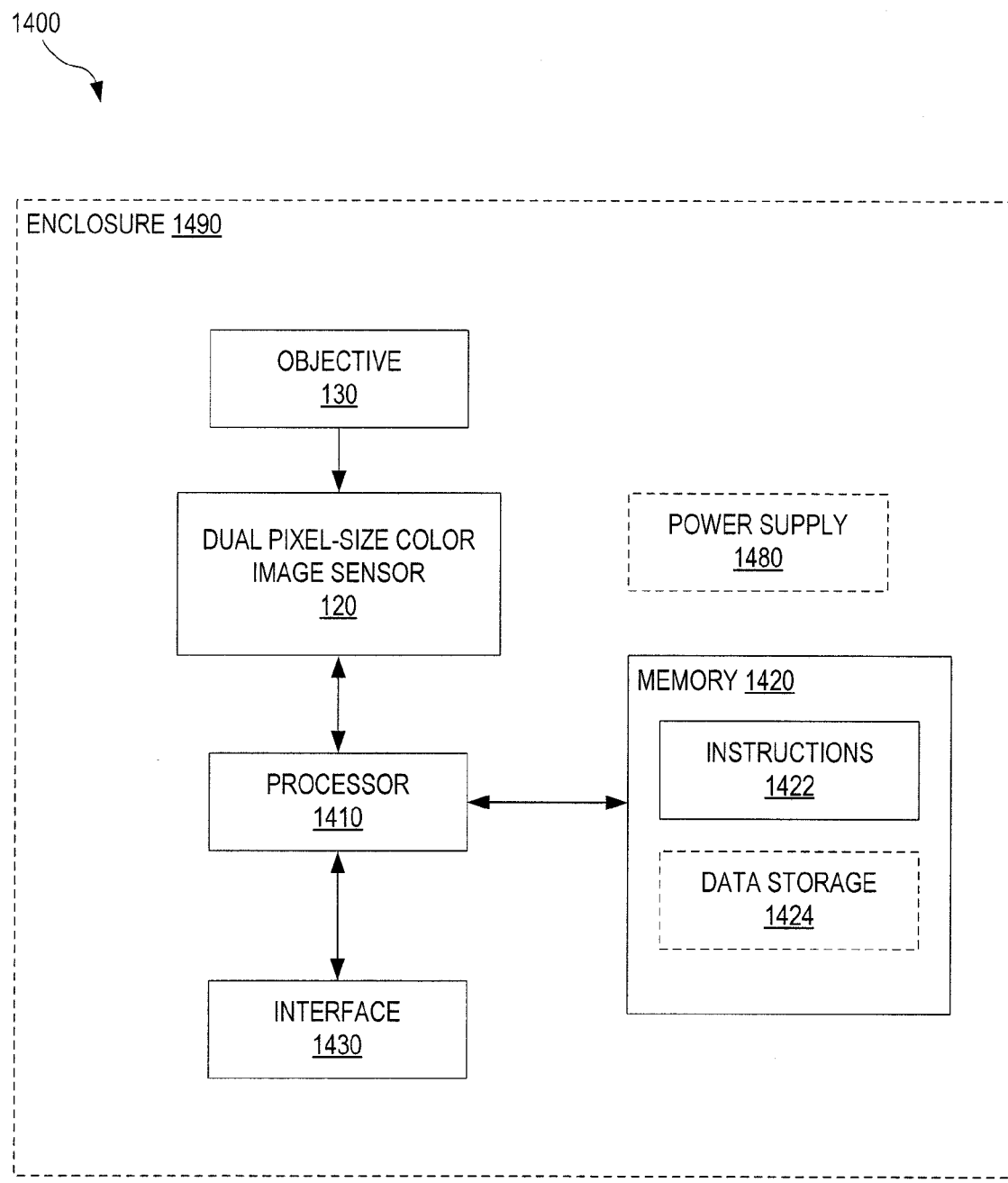
FIG. 14 illustrates one exemplary HDR imaging system that includes a dual pixel-size color image sensor, according to an embodiment.

FIG. 14 illustrates an HDR color imaging system 1400 for capture of HDR color images in a single frame. HDR color imaging system 1400 includes dual pixel-size color image sensor 120 of FIG. 1 for capture of images of a scene. The image is formed by objective 130 of FIG. 3. In certain embodiments, dual pixel-size color image sensor 120 is one of dual pixel-size color image sensor 200 (FIGS. 2A and 2B), dual pixel-size color image sensor 800 (FIG. 8), dual pixel-size color image sensor 1100 (FIG. 11), and dual pixel-size color image sensor 1200 (FIG. 12). Dual pixel-size color image sensor 120 is in communication with a processor 1410, which is in communication with a non-volatile memory 1420 and an interface 1430. Memory 1420 includes machine-readable instructions 1422 such that processor 1410 according to instructions 1422 may process images captured by dual pixel-size color image sensor 120. In an embodiment, instructions 1422 further includes instructions for controlling image capture by dual pixel-size color image sensor 120. Optionally, memory 1420 includes a data storage 1424 for storage of, e.g., image data received from dual pixel-size color image sensor 120 and/or images produced by image processing by processor 1410, such as HDR images.

Interface 1430 communicates data to a recipient such as a person or an external computer system. Interface 1430 may include a display; an Ethernet port, a USB port, a Bluetooth port, a Wi-Fi port, or other form of connectivity; and/or a control panel for controlling image capture by dual pixel-size color image sensor 120 and/or other functionality of HDR imaging system 1400. For example, interface 1430 may receive a command to capture an image, settings for dual pixel-size color image sensor 120 such as exposure time and gain, and/or settings for objective 130 such as focus, zoom, and/or aperture stop. Optionally, HDR imaging system 1400 includes an enclosure 1490 for environmental protection of components included in HDR imaging system 1400. Enclosure 1490 is, for example, a camera body. HDR imaging system further includes an optional power supply 1480.

Dual pixel-size color image sensor 200 and its embodiments, dual pixel-size color image sensor 800, dual pixel-size color image sensor 1100, and dual pixel-size color image sensor 1200 may have any number of color pixels, for example 768×1024 pixels, 1024×1280 pixels, 900×1600 pixels, 3000×4000 pixels, without departing from the scope hereof.

Combinations of Features

Features described above as well as those claimed below may be combined in various ways without departing from the scope hereof. For example, it will be appreciated that aspects of one dual pixel-size color image sensor or method for its manufacture described herein may incorporate or swap features of another dual pixel-size color image sensor or method for its manufacture described herein. The following examples illustrate possible, non-limiting combinations of embodiments described above. It should be clear that many other changes and modifications may be made to the methods and system herein without departing from the spirit and scope of this invention:

(A) A dual pixel-size color image sensor may include: an imaging surface, for imaging of incident light; and a plurality of color pixels, each color pixel including (a) large photosites, including large first-color photosites sensitive to a first color of the incident light, and (b) small photosites including small first-color photosites sensitive to the first color of the incident light, the large and small first-color photosites being arranged such that connected regions of the imaging surface, not associated with large first-color photosites and not associated with small first-color photosites, are not continuous straight lines.

(B) In the dual pixel-size image sensor denoted as (A), the large photosites may include four large photosites, and the small photosites may include four small photosites.

(C) In the dual pixel-size image sensor denoted as (B), the four large photosites may include two large first-color photosites, and the four small photosites including two small first-color photosites.

(D) In the dual pixel-size color image sensor denoted as (C), the four large photosites may further include two large other-color photosites, sensitive to a color of the incident light different from the first color, and the four small photosites may further include two small other-color photosites, sensitive to a color of the incident light different from the first color.

(E) In the dual pixel-size color image sensor denoted as (D), connected regions of the imaging surface, not associated with large first-color photosites and not associated with small first-color photosites, may be occupied by large other-color photosites, small other-color photosites, or a combination thereof.

(F) In either of the dual pixel-size color image sensors denoted as (D) and (E), the two large other-color photosites may include a second-color photo site, sensitive to a second color of the incident light, and a third-color photosite sensitive to a third color of the incident light; and the two small other-color photosites may include a second-color photo site, sensitive to the second color of the incident light, and a third-color photosite sensitive to the third color of the incident light.

(G) In any of the dual pixel-size color image sensors denoted as (D) through (F), each connected region of large and/or small other-color photosites may be centered on a common straight line comprising at most one small other-color photosite and two large other-color photosites.

(H) In any of the dual pixel-size color image sensors denoted as (A) through (G), the connected regions of the imaging surface, not associated with large first-color photosites and not associated with small first-color photosites and not proximate an edge of the imaging surface, may form connected linear segments, wherein linear segments of a pair of connected linear segments are not parallel.

(I) In the dual pixel-size color image sensor denoted as (H), the linear segments of a pair of connected linear segments may be at a relative angle of approximately 90° with respect to each other.

(J) In the dual pixel-size color image sensor denoted as (I), each linear segment may be no longer than the total length of two large first-color photosites and one small first-color photosite.

(K) A dual pixel-size color image sensor may include an imaging surface, for imaging of incident light; and a plurality of color pixels, each color pixel including (a) large photosites, including large first-color photosites sensitive to a first color of the incident light, and (b) small photosites including small first-color photosites sensitive to the first color of the incident light, the large and small first-color photosites being arranged such that connected regions of the imaging surface, not associated with large first-color photosites and not associated with small first-color photosites, have an area no greater than the area of two large first-color photosites and two small first-color photosites.

(L) In the dual pixel-size image sensor denoted as (K), the large photosites may include four large photosites, and the small photosites may include four small photosites.

(M) In the dual pixel-size image sensor denoted as (L), the four large photosites may include two large first-color photosites, and the four small photosites may include two small first-color photosites.

(O) In the dual pixel-size color image sensor denoted as (M), the four large photosites may further include two large other-color photosites, sensitive to a color of the incident light different from the first color; and the four small photosites may further include two small other-color photosites, sensitive to a color of the incident light different from the first color.

(P) In the dual pixel-size color image sensor denoted as (O), the two large other-color photosites may include a second-color photo site, sensitive to a second color of the incident light, and a third-color photosite sensitive to a third color of the incident light; and the two small other-color photosites may include a second-color photo site, sensitive to a second color of the incident light, and a third-color photosite sensitive to a third color of the incident light.

(Q) In any of the dual pixel-size color image sensors denoted as (O) and (P), each connected region of large other-color photosites, small other-color photosites, or a combination thereof, may include at most two small other-color photosites and two large other-color photosites.

(R) In any of the dual pixel-size color image sensors denoted as (A) through (Q), the first color may represent a green portion of the visible spectrum.

(S) In any of the dual pixel-size color image sensor denoted as (F), (G), and (P) through (R), the first color may represent a green portion of the visible spectrum, and the second color may represent a portion of the visible spectrum having longer wavelengths than the first color, and the third color may represent a portion of the visible spectrum having shorter wavelength than the first color.

(T) In any of the dual pixel-size color image sensors denoted as (A) through (S), the large photosites may be more sensitive to light than the small photosites.

(U) A method for manufacturing a color filter array on an imaging surface of a dual pixel-size image sensor may include forming a first-color coating on first portions of the imaging surface to form large and small first-color photosites sensitive to a first color, wherein connected portions of the imaging surface, different from the first portions, are not continuous straight lines.

(V) In the method denoted as (U), the connected portions of the imaging surface, different from the first portions, may form connected linear segments, wherein the linear segments of each pair of connected linear segments are non-parallel.

(X) In the method denoted as (V), a relative angle between the linear segments of each pair of connected linear segments may introduce resistance to fluid flow on the imaging surface through the connected linear segments.

(Y) In the method denoted as (X), the relative angle may be in the range from 80° to 100°.

(Z) In any of the methods denoted as (V) through (Y), each linear segment may be no longer than the total length of two large first-color photosites and one small first-color photosite.

(AA) In the method denoted as (U), the connected portions of the imaging surface, different from the first portions, may have an area no greater than the area of two large first-color photosites and two small first-color photosites.

(AB) Any of the methods denoted as (U) through (AA) may further include (a) applying, after the step of forming a first-color coating, a second-color photoresist to a structure holding the image sensor, (b) spinning the dual-pixel size image sensor about an axis substantially orthogonal to the imaging surface, to disperse the second-color photoresist on the imaging surface, and (c) developing the second-color photoresist in second portions of the imaging surface, located within the other portions of the imaging surface, to form large and small photosites sensitive to a second color.

(AC) In the method denoted as (AB), resistance to flow of the second-color photoresist across the imaging surface, in the step of spinning, may be substantially uniform for all directions of flow of the second-color photoresist.

(AD) In any of the methods denoted as (U) through (AC), the first color may represent a green portion of the visible spectrum.

(AE) In any of the methods denoted as (AB) through (AC), the first color may represent a green portion of the visible spectrum, and the second color may represent a portion of the visible spectrum having longer wavelengths than the first color, and the third color may represent a portion of the visible spectrum having shorter wavelength than the first color.

Changes may be made in the above methods and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A dual pixel-size color image sensor, comprising:
an imaging surface, for imaging of incident light; and
a plurality of color pixels, each color pixel comprising (a) four large photosites, including two large first-color photosites sensitive to a first color of the incident light, and (b) four small photosites including two small first-color photosites sensitive to the first color of the incident light, the large and small first-color photosites being arranged such that connected regions of the imaging surface, not associated with large first-color photosites and not associated with small first-color photosites, are not continuous straight lines, all connected regions, except connected regions located at perimeter of the imaging surface, forming linear segments, wherein the linear segments have at least one property selected from the group consisting of:
   (i) linear segments of each connected pair of the linear segments are at a relative angle of approximately 90° with respect to each other, and
   (ii) each of the linear segments being no longer than total length of two large first-color photosites and one small first-color photosite.

2. The dual pixel-size color image sensor of claim 1, the large photosites being more sensitive to light than the small photosites.

3. A dual pixel-size color image sensor, comprising:
an imaging surface, for imaging of incident light; and
a plurality of color pixels, each color pixel comprising (a) four large photo sites, including two large first-color photosites sensitive to a first color of the incident light, and (b) four small photo sites including two small first-color photo sites sensitive to the first color of the incident light, the large and small first-color photosites being arranged such that connected regions of the imaging surface, not associated with large first-color photo sites and not associated with small first-color photo sites, are not continuous straight lines,
the four large photo sites further comprising two large other-color photo sites, sensitive to a color of the incident light different from the first color, and
the four small photo sites further comprising two small other-color photo sites, sensitive to a color of the incident light different from the first color;
wherein the connected regions of the imaging surface, not associated with large first-color photo sites and not associated with small first-color photo sites, are occupied by large other-color photo sites, small other-color photo sites, or a combination thereof, and wherein each connected region of large and/or small other-color photosites centered on a common straight line comprises at most one small other-color photosite and two large other-color photo sites.

4. The dual pixel-size color image sensor of claim 3,
the two large other-color photo sites comprising a second-color photo site, sensitive to a second color of the incident light, and a third-color photo site sensitive to a third color of the incident light; and
the two small other-color photo sites comprising a second-color photo site, sensitive to the second color of the incident light, and a third-color photo site sensitive to the third color of the incident light.

5. The dual pixel-size color image sensor of claim 4, the first color representing a green portion of the visible spectrum, the second color representing a portion of the visible spectrum having longer wavelengths than the first color, and the third color representing a portion of the visible spectrum having shorter wavelength than the first color.

6. A dual pixel-size color image sensor, comprising:
an imaging surface, for imaging of incident light; and
a plurality of color pixels, each color pixel comprising (a) four large photosites, including two large first-color photosites sensitive to a first color of the incident light, and (b) four small photosites including two small first-color photosites sensitive to the first color of the incident light, the large and small first-color photosites further being arranged such that connected regions of the imaging surface, not associated with large first-color photosites and not associated with small first-color photosites, (i) are not continuous straight lines, and (ii) have an area no greater than area of two large first-color photosites and two small first-color photosites.

7. The dual pixel-size color image sensor of claim 6, the large photosites being more sensitive to light than the small photosites.

8. The dual pixel-size color image sensor of claim 6,
the four large photosites further comprising two large other-color photosites, sensitive to a color of the incident light different from the first color; and
the four small photosites further comprising two small other-color photosites, sensitive to a color of the incident light different from the first color.

9. The dual pixel-size color image sensor of claim 8,
the two large other-color photosites comprising a second-color photo site, sensitive to a second color of the incident light, and a third-color photosite sensitive to a third color of the incident light; and
the two small other-color photosites comprising a second-color photo site, sensitive to a second color of the incident light, and a third-color photosite sensitive to a third color of the incident light.

10. The dual pixel-size color image sensor of claim 9, the first color representing a green portion of the visible spectrum, the second color representing a portion of the visible spectrum having longer wavelengths than the first color, and the third color representing a portion of the visible spectrum having shorter wavelength than the first color.

11. The dual pixel-size color image sensor of claim 8, each connected region of large other-color photosites-, small other-color photosites, or a combination thereof, comprising at most two small other-color photosites and two large other-color photosites.

12. A method for manufacturing a color filter array on an imaging surface of a dual pixel-size image sensor, comprising:
   forming a first-color coating on first portions of the imaging surface to form large and small first-color photosites sensitive to a first color, wherein connected portions of the imaging surface, different from the first portions, are not continuous straight lines, and wherein the connected portions have at least one property selected from the group consisting of:
   (i) the connected portions forming connected linear segments such that the linear segments of each connected pair of the linear segments are non-parallel, and
   (ii) the connected portions having an area greater than area of two large first-color photosites and two small first-color photosites.

13. The method of claim 12, a relative angle between the linear segments of each pair of connected linear segments introducing resistance to fluid flow on the imaging surface through the connected linear segments.

14. The method of claim 12, each linear segment being no longer than the total length of two large first-color photo sites and one small first-color photosite.

15. The method of claim 12, the relative angle being in the range from 80° to 100°.

16. A method for manufacturing a color filter array on an imaging surface of a dual pixel-size image sensor, comprising:
   forming a first-color coating on first portions of the imaging surface to form large and small first-color photo sites sensitive to a first color, wherein connected portions of the imaging surface, different from the first portions, are not continuous straight lines;
   applying, after the step of forming a first-color coating, a second-color photoresist to a structure holding the image sensor;
   spinning the dual-pixel size image sensor about an axis substantially orthogonal to the imaging surface, to disperse the second-color photoresist on the imaging surface; and
   developing the second-color photoresist in second portions of the imaging surface, located within the other portions of the imaging surface, to form large and small photo sites sensitive to a second color.

17. The method of claim 16, resistance to flow of the second-color photoresist across the imaging surface, in the step of spinning, being substantially uniform for all directions of flow of the second-color photoresist.

* * * * *